United States Patent [19]
Shingyoji et al.

[11] Patent Number: 5,640,700
[45] Date of Patent: Jun. 17, 1997

[54] DIELECTRIC WAVEGUIDE MIXER

[75] Inventors: Masahito Shingyoji, Sakado; Hiroyuki Ando, Niiza; Shigiki Kato, Shiki; Hiroshi Uematsu, Asaka, all of Japan

[73] Assignee: Honda Giken Kogyo Kabushiki Kaisha, Tokyo, Japan

[21] Appl. No.: 180,955

[22] Filed: Jan. 13, 1994

[30] Foreign Application Priority Data

Jan. 13, 1993 [JP] Japan .................. 5-020616
Jan. 13, 1993 [JP] Japan .................. 5-020617

[51] Int. Cl.$^6$ ............................. H04B 1/26
[52] U.S. Cl. ............. 455/328; 455/81; 455/330; 333/250
[58] Field of Search ............... 455/323, 328, 455/330, 333, 80, 81; 327/583; 333/250

[56] References Cited

U.S. PATENT DOCUMENTS

| | | | |
|---|---|---|---|
| 3,995,238 | 11/1976 | Knox et al. | 323/21 R |
| 4,215,313 | 7/1980 | Chang et al. | 455/322 |
| 4,232,401 | 11/1980 | Chang et al. | 455/328 |
| 4,380,020 | 4/1983 | Yuan et al. | 330/250 |
| 4,541,120 | 9/1985 | Szabo | 455/81 |
| 4,563,773 | 1/1986 | Dixon, Jr. et al. | 455/327 |
| 4,573,213 | 2/1986 | Dixon, Jr. et al. | 455/330 |
| 4,613,989 | 9/1986 | Fende et al. | 455/328 |
| 4,742,571 | 5/1988 | Cetron | 455/328 |
| 4,777,654 | 10/1988 | Conti | 455/81 |
| 4,789,840 | 12/1988 | Albin | 330/250 |
| 4,955,079 | 9/1990 | Connerney et al. | 455/328 |
| 5,023,594 | 6/1991 | Wallace | 330/250 |

FOREIGN PATENT DOCUMENTS 2483085 5/1980 France.

OTHER PUBLICATIONS

1989 IEEE MTT–S International Microwave Symposium Digest, vol. 1, pp.1083–1086, T. Yoneyama: "Millimeter-Wave Transmitter and Receiver Using the Nonradiative Dielectric Waveguide".

Primary Examiner—Edward F. Urban
Attorney, Agent, or Firm—Lyon & Lyon

[57] ABSTRACT

A non-radiative dielectric waveguide mixer includes at least one conductive plate, a dielectric waveguide held on said conductive plate and a solid-state device disposed across said dielectric waveguide for mixing at least two high-frequency signals which are propagated in opposite directions along said dielectric waveguide. The non-radiative dielectric waveguide mixer may be combined with a high-frequency signal generator and an antenna mechanism to provide a non-radiative dielectric waveguide radar module.

6 Claims, 5 Drawing Sheets

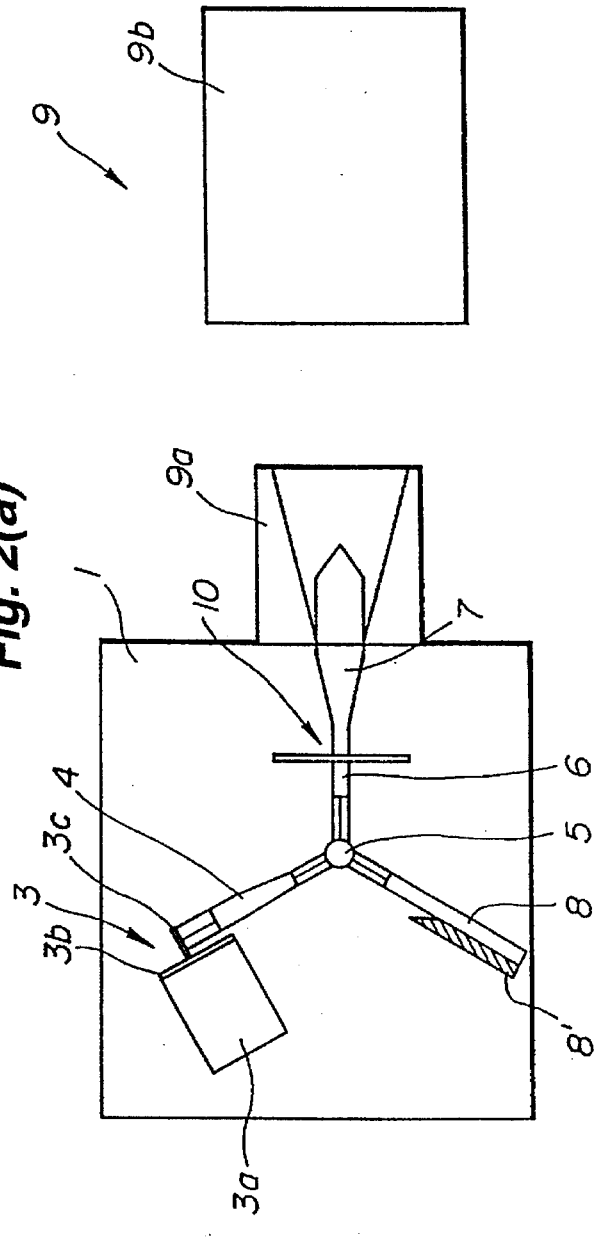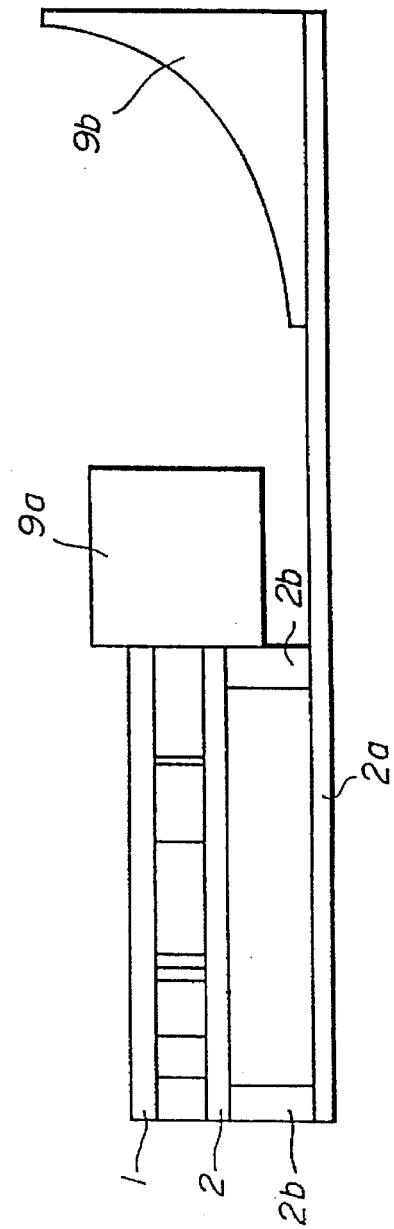

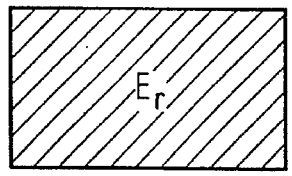
Fig. (6a)
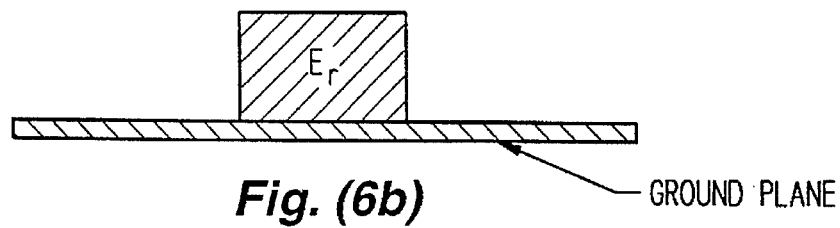
Fig. (6b) — GROUND PLANE
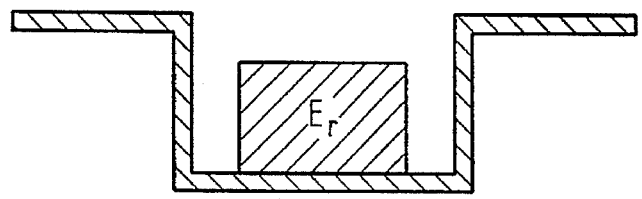
Fig. (6c)
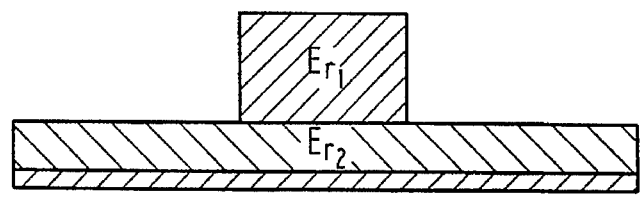
Fig. (6d)
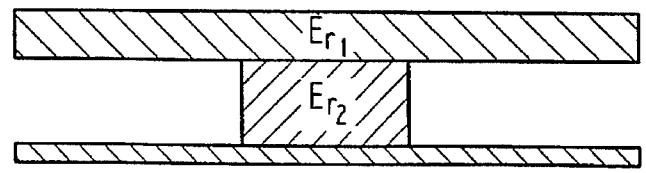
Fig. (6e)

DIELECTRIC WAVEGUIDE MIXER

BACKGROUND OF THE INVENTION

1. Field of the Invention

The present invention relates to a dielectric waveguide radar module for use as a component in a millimeter wave radar device installed on a motor vehicle, and more particularly to a dielectric waveguide mixer for use in such a radar module.

1. Description of the Prior Art

Radar devices for use on motor vehicles such as automobiles in combination with warning units for preventing collisions are required to have a high degree of resolution for detecting objects at close distances, for example, at distances of up to about several decimeters. In view of this high-resolution requirement, FM radar systems are preferred over pulsed radar systems for use in vehicle-mounted applications. Since the maximum range to a target, such as a preceding motor vehicle or an upcoming motor vehicle, that may be detected is a relatively short distance, roughly several hundred meters, it is suitable for vehicle-mounted radar systems to use radiowaves in the millimeter range. These waves have a frequency of about 60 GHz and can be attenuated greatly upon propagation in order to prevent propagation beyond a necessary range and also to minimize interference with existing microwave communications equipment. Use of millimeter waves is also preferable from the viewpoint of reducing the size of a radar module which may include an antenna, FM signal generators in front and rear stages, a mixer, and other components.

Heretofore, FM radar modules in the millimeter range have been constructed in the form of a microstrip waveguide or a waveguide. Because microstrip waveguides radiate a large amount of power, they suffer a large loss, and interference tends to result between multiple modules. This results in a reduction in measuring accuracy. A conventional waveguide is disadvantageous in that its circuit is large in size and expensive.

One attempt to solve the above problems is illustrated by a non-radiative dielectric waveguide such as that disclosed in the article "Millimeter wave integrated circuit using a non-radiative dielectric waveguide" written by Yoneyama et al. and published in the Journal of Electronic Information Communications Society, Vol. J 73 C-1, No. 3, pp. 87 94, March 1990. The disclosed non-radiative dielectric waveguide comprises two confronting conductive plates spaced from each other by a distance slightly smaller than a half wavelength and a rod-shaped dielectric member inserted between the conductive plates for allowing propagations only along the rod-shaped dielectric member. The upper and lower surfaces of the non-radiative dielectric waveguide are completely shielded by the conductive plates. Since the distance between the conductive plates is shorter than a half wavelength, radiowaves are prevented from leaking laterally out of the non-radiative dielectric waveguide. Therefore, any power radiation from the non-radiative dielectric waveguide is very small, effectively avoiding interference between multiple modules and also radiation loss in each module. Various components including a directional coupler and an isolator can easily be fabricated by positioning non-radiative dielectric waveguides closely to each other or adding ferrite. Therefore, a plurality of high-frequency functional components can be fabricated between two flat metal plates, making it possible to reduce the overall size of a module to such an extent which is comparable with conventional microwave IC (MIC).

The above article also discloses transmitter and receiver structures for use in the millimeter wave band which employ non-radiative dielectric waveguides. The radar module disclosed in the above article has a problem in that its overall size is large because its transmitter and receiver are of separate structures. Further, it is difficult to reduce the size of the disclosed radar module. This makes it difficult to dispose such a device in a door or a bumper of an automobile.

Since the transmitter and receiver of the disclosed radar module are separate structures, each of the transmitter and receiver must have a high-frequency generator of its own, making the radar module expensive. The radar module is designed as a Doppler radar using a constant wave (CW) of a constant frequency. However, such a radar arrangement cannot be applied to an FM radar system for detecting the positions (bearing and relative distance) of obstacles which may exist around the automobile.

The above article further shows a single balanced mixer. While the single balanced mixer is advantageous in that it suffers low noise, the cost of its parts is high and it is difficult to reduce the size of the module employing the same because the mixer employs two diodes of the same characteristics and requires impedance matching. In order to achieve impedance matching between the waveguide and two diodes having the same characteristics, it is necessary to carry out a complex adjusting process of varying the air gap and the thickness of a thin film having a high dielectric constant. Since it is very difficult to effect such an adjusting process, the adjusting process may produce non-uniform characteristics in radar modules and reduce the rate of mass production of radar modules. The balanced mixer requires, in principle, that a local signal be divided and supplied to the mixer diodes. Therefore, the balanced mixer should be supplied with a local signal of considerably high power in order to produce an output signal of a desired level. In the case where a homodyne radar system with a single high-frequency generator is designed, the output signal transmitted from the transmission antenna is decreased by an amount commensurate with the assigned energy, since a considerable proportion of the output signal from the generator has to be assigned to the local signal. As a consequence, the maximum distance that can be covered by the radar system is reduced.

SUMMARY OF THE INVENTION

It is therefore an object of the present invention to provide a dielectric waveguide mixer and a dielectric waveguide radar module which are made up of a reduced number of parts, are small in size, and provide improved performance.

According to the present invention, there is provided a dielectric waveguide mixer comprising at least one conductive plate, a dielectric waveguide held on the conductive plate, and a solid-state device disposed across the dielectric waveguide for mixing at least two high-frequency signals which are propagated in opposite directions along the dielectric waveguide.

An FM radar module which incorporates the above dielectric waveguide mixer comprises at least one conductive plate, high-frequency signal generating means held on the conductive plate for generating a high-frequency signal, antenna means for radiating out the high-frequency signal, propagating means for propagating signals, the propagating means having at least a dielectric waveguide held on the conductive plate and connected between the high-frequency signal generating means and the antenna means, for propagating, in a first direction, a high-frequency signal generated by the high-frequency signal generating means to the antenna means for radiation therefrom and propagating, in a second direction opposite to the first direction, a signal reflected by an external object to which the high-frequency signal is radiated and received by the antenna means, and mixer means disposed across the dielectric waveguide for mixing the signals propagated in the first and second directions into a beat signal.

With the above arrangement, a high-frequency signal (FM signal) in the millimeter wave band generated by the high-frequency signal generating means signal generator is supplied through a non-radiative dielectric waveguide as the propagating means to the antenna means, e.g., a common transmission and reception antenna, by which the signal is radiated. A signal reflected by an object is received by the transmission and reception antenna and propagated through the non-radiative dielectric waveguide in a direction opposite to the direction in which the high-frequency signal is propagated to the transmission and reception antenna. The mixer means, e.g., a single-diode mixer, is disposed across the non-radiative dielectric waveguide. The single-diode mixer is supplied with two oppositely directed high-frequency signals, i.e., the signal propagated to the common transmission and reception antenna and the signal received thereby, and mixes the supplied high-frequency signal into a beat signal having a certain frequency.

If the high-frequency signal generating means is an FM signal generator, then the frequency of the beat signal represents the period of time over which the FM signal travels from the antenna to an object and back. This period may be used to calculate the distance to the object. If the high-frequency signal generating means is a high-frequency signal generator for generating a high-frequency signal having a constant frequency, then the frequency of the beat signal represents the relative speed with respect to the object. The dielectric waveguide mixer or the radar module which incorporates the dielectric waveguide mixer may be small in size as the single-diode mixer for mixing the oppositely directed high-frequency signals is disposed in a certain position on the non-radiative dielectric waveguide.

When the single-diode mixer is positioned across the non-radiative dielectric waveguide, the single-diode mixer is laterally offset from the position where the maximum electric field intensity in an LSM01 mode in the non-radiative dielectric waveguide is exhibited for achieving impedance matching between the single-diode mixer and the non-radiative dielectric waveguide. Unlike the conventional process of achieving impedance matching between a mixer and a dielectric waveguide, the dielectric waveguide mixer or radar module of the present invention requires no thin film having a high dielectric constant and no air gaps for impedance matching, thus minimizing process variations of manufactured dielectric waveguide mixers or radar modules. The single-diode mixer which employs such an impedance matching process may be reduced in size. This allows the radar module to be reduced in overall size and reduces variations in radar module characteristics, because it is not necessary to match the characteristics of two diodes which would otherwise be necessary.

The above and further objects, details and advantages of the present invention will become apparent from the following detailed description of preferred embodiments thereof, when read in conjunction with the accompanying drawings.

BRIEF DESCRIPTION OF THE DRAWINGS

FIG. 2(a) is a plan view of a dielectric waveguide radar module according to a second embodiment of the present invention;

FIG. 2(b) is a side elevational view of the dielectric waveguide radar module shown in FIG. 1(a);

FIGS. 6(a)–6(e) illustrate various embodiments of single plate open dielectric waveguides.

DETAILED DESCRIPTION OF THE PREFERRED EMBODIMENTS

Figure 1:
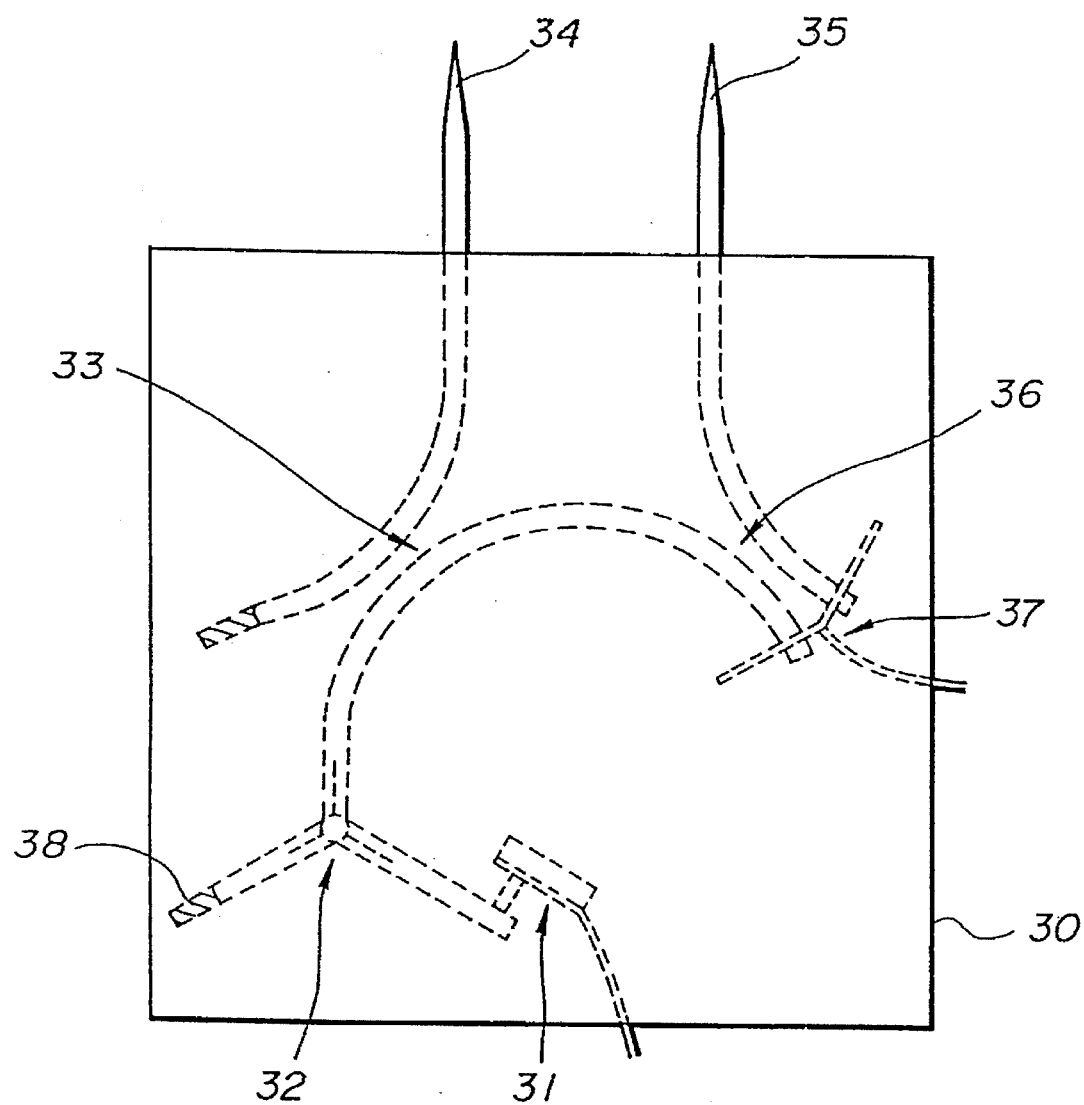
FIG. 1 is a plan view of a dielectric waveguide radar module according to a first embodiment of the present invention.

A dielectric waveguide radar module, shown in FIG. 1, according to a first embodiment of the present invention is designed such that it is smaller as a whole than a conventional radar module having a separate transmitter and receiver as disclosed in the above article; is configured for easy installation on a mobile object such as an automobile; employs a single high-frequency generator; and comprises a homodyne radar system for overall cost reduction.

As shown in FIG. 1, the dielectric waveguide radar module basically comprises a non-radiative dielectric waveguide having a linear or curved dielectric rod inserted between upper and lower parallel conductive plates 30. The dielectric waveguide radar module also includes a high-frequency generator 31 comprising a Gunn diode and a varactor diode for generating a high-frequency FM signal, an isolator 32, directional couplers 33 and 36, a transmission antenna 34, a reception antenna 35, and a single balanced mixer 37. The directional coupler 33 comprises first and second dielectric rods which are disposed closely to each other, the first dielectric rod being connected to the isolator 32 and the second dielectric rod being connected to the transmission antenna 34. The directional coupler 36 comprises the first dielectric rod and a third dielectric rod which are disposed closely to each other, the third dielectric rod being connected to the reception antenna 35.

An FM signal in the millimeter wave band which is generated by the high-frequency generator 31 passes through the isolator 32, after which about a half of the electric power of the FM signal is supplied through the directional coupler 33 to the transmission antenna 34. The FM signal supplied to the transmission antenna 34 is radiated as a transmitted signal into ambient space. A signal that is reflected by an object that exists in the ambient space is received by the reception antenna 35. The received signal is supplied through the directional coupler 36 to two mixer diodes of the single balanced mixer 37. At this time, the signal reflected by the object is also received by the transmission antenna 34, and sent by the isolator 32 as an unwanted signal to a resistive terminator 38, which converts the signal into heat that is dissipated. The remaining energy of the FM signal that is supplied to the directional coupler 33 is applied as a local signal to the directional coupler 36, which divides the signal into two halves that are supplied to the respective diodes of the single balanced mixer 37. The single balanced mixer 37 mixes the received signal with the local signal, producing a beat signal having a frequency which represents the relative distance between an object and the radar module.

An FM radar module according to a second embodiment of the present invention will be described below with reference to FIGS. 2(a) and 2(b). The FM radar module according to the second embodiment is effective to solve a number of problems suffered by conventional balanced mixers.

As shown in FIGS. 2(a) and 2(b), the FM radar module comprises an upper conductive plate 1, a lower conductive plate 2, a high-frequency signal (FM signal) generator 3, dielectric waveguides 4, 6, 7, 8 serving as non-radiative dielectric waveguide means for propagating a high-frequency signal, a circulator 5, a resistive terminator 8, a common transmission and reception antenna horn 9a, a reflector 9b, and a single-diode mixer 10.

The high-frequency signal generator 3 comprises a gunn diode mount 3a, such as a metal block; a microstrip line 3b held on a side surface of the gunn diode mount 3a and supporting thereon a gunn diode for generating a high-frequency signal and a varactor diode for modulating a frequency; and a metal strip 30 doubling as a resonator for guiding a high-frequency signal (FM signal) generated by the gunn diode on the microstrip line 3b to the non-radiative dielectric waveguides, including the dielectric waveguide 4. The metal strip 3c may comprise a thin film or a metal rod.

The upper and lower conductive plates 1 and 2 lie parallel to each other and are spaced from each other by a distance that is slightly smaller than one half of a wavelength of the FM signal in the millimeter wave band that is generated by the gunn diode. Therefore, the FM signal can be propagated only along the dielectric waveguides between the upper and lower conductive plates 1 and 2. The FM signal is propagated in two major propagation modes, i.e., an LSM01 mode and an LSE01 mode. In order to suppress the LSM01 mode that is of low logs, a mode suppressor may be embedded in a certain location in the dielectric waveguides. As shown in FIG. 2(b), the lower conductive plate 2 is supported on a support plate 2(a) by a plurality of support columns 1(b).

Figure 3:
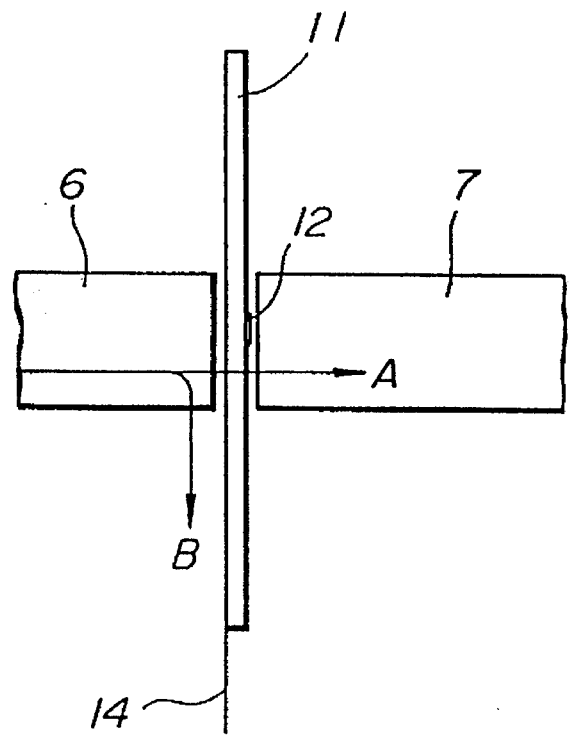
FIG. 3 is an enlarged fragmentary plan view of a single-diode mixer and its associated components in the dielectric waveguide radar module shown in FIG. 2(a)
Figure 4:
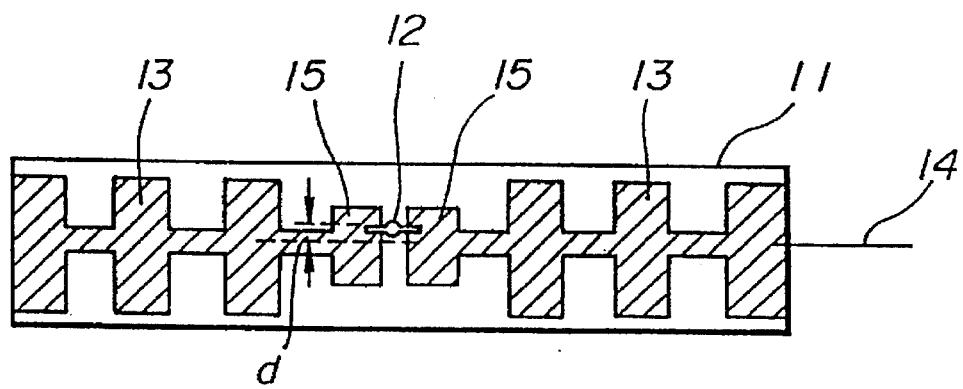
FIG. 4 is an enlarged front elevational view of the single-diode mixer and its associated components in the dielectric waveguide radar module shown in FIG. 2(a)

As shown in FIGS. 3 and 4, the single-diode mixer 10 does not require air gaps or thin films of a high dielectric constant on its front and rear ends for impedance matching. The dielectric waveguides 6 and 7 have respective portions of constant width and height that are positioned one on each side of a dielectric substrate 11 on which a mixer diode 12 is mounted, the portions of the dielectric waveguides 6 and 7 having vertical end surfaces held against the dielectric substrate 11.

Diode attachment patterns 15 are juxtaposed on a central region of the dielectric substrate 11 at one surface thereof and spaced from each other. The mixer diode 12 has its terminals connected to the respective diode attachment patterns 15 such that the mixer diode 12 is laterally offset a distance d from the center of the dielectric substrate 11. Specifically, the mixer diode 12 is laterally spaced the distance d from the position where the maximum electric field intensity in the LSM01 mode in the dielectric waveguide 6 is exhibited. The impedance matching between the dielectric waveguides 6 and 7 and the mixer diode 12 can be achieved by adjusting the distance d and optimizing the area and shape of the diode attachment patterns 15, without any air gaps or thin films of a high dielectric constant.

A plurality of parallel diodes may be disposed on the diode attachment patterns 15, or a solid-state device of the same function as the diode 12 may be employed in place of the diode 12. The diode attachment patterns 15 may be mounted on opposite surfaces of the dielectric substrate 11, and mixer diodes 12 may be mounted on the diode attachment patterns 15 on each surface of the dielectric substrate 11.

The distance d and the area and shape of the diode attachment patterns 15 may be selected to control the ratio of the electric power of an electromagnetic wave A that is transmitted through the single-diode mixer 10 and the electric power of an electromagnetic wave B that is converted by the single-diode mixer 10.

To the diode attachment patterns 15, there are connected respectively two ¼ choke patterns for preventing the high-frequency signal from leaking from the non-radiative dielectric waveguide and also for supplying a bias voltage to the mixer diode 12. The beat signal that is converted by the single-diode mixer 10 and from which undesired high-frequency signal is removed by the ¼ choke patterns is supplied to an external circuit through a lead 14.

In the non-radiative dielectric waveguide shown in FIG. 2(a), the dielectric waveguides 6 and 7 have a common transmission and reception antenna 9 on one end thereof and have the single-diode mixer 10 disposed intermediately between them. The dielectric waveguide 4 has a high-frequency signal generator 3 disposed on one end, and the dielectric waveguide 8 has a resistive terminator 8' disposed on one end. The other ends of the waveguides 4, 6 and 8 are connected to the circulator 5 such that the dielectric waveguides 6 and 4 extend radially outwardly from the centrally located circulator 5 between the parallel conductive plates 1 and 2. An FM signal in the millimeter wave band that is generated by the FM signal generator 3 is propagated through the non-radiative dielectric waveguide including the dielectric waveguide 1 to the circulator 5, which leads the FM signal to the non-radiative dielectric waveguide including the output dielectric waveguide 6. The FM signal reaches the single-diode mixer 10 that is positioned across the output dielectric waveguide 6. Most of the electric power of the FM signal is transmitted through the single-diode mixer 10 and radiated out from the common transmission and reception antenna 9. The remaining electric power is absorbed as a frequency-converting local signal into the single-diode mixer 10.

As shown in FIGS. 2(a) and 2(b), the common transmission and reception antenna 9 comprises a horn antenna 9a having an opening that is linearly enlarged from its base and the antenna 9a is connected to the parallel conductive plates 1 and 2 toward its distal end. A parabolic reflector 9b is disposed in front of the horn antenna 9a. The horn antenna 9a and the parabolic reflector 9b jointly serve to radiate the FM signal that has been propagated through the non-radiative dielectric waveguide to the dielectric waveguide 7 joined to the dielectric waveguide 6. The radiated FM signal is reflected by an object, and the reflected signal is received by the parabolic reflector 9b and the horn antenna 9a, and guided to the dielectric waveguide 7. Thereafter, the received signal is propagated through the non-radiative dielectric waveguide including the dielectric waveguide 6 to the single-diode mixer 10.

More specifically, a portion of a high-frequency signal generated by the high-frequency signal generator 3 is propagated through the dielectric waveguide 4, the circulator 5, and the dielectric waveguide 6 to the single-diode mixer 10, and the remaining portion of the high-frequency signal is transmitted through the mixer 10 and radiated through the common transmission and reception antenna 9. The radiated high-frequency signal is reflected by an object, and received by the common transmission and recaption antenna 9. A portion of the received signal is propagated through the dielectric waveguide 6 to the mixer 10 where it is mixed with the portion of the high-frequency signal that has been propagated through the dielectric waveguide 4, the circulator 5, and the dielectric waveguide 6 to the single-diode mixer 10. The remaining portion of the received signal is transmitted through the mixer 10 and the dielectric waveguide 8 to the resistive terminator 8', which absorbs the energy of the supplied signal.

As described above, the single-diode mixer 10 is supplied with signals propagated in opposite directions, i.e., the FM signal to be radiated through the common transmission and reception antenna 9 and the signal reflected by the object and received by the common transmission and reception antenna 9. The mixer 10 mixes the supplied signals into a beat signal having a low frequency ranging from several tens of KHz to several MHz. The beat signal is then supplied through the lead 14 to a circuit external to the radar module. The remaining portion of the received signal that is transmitted through the mixer 10 is propagated through the circulator 5 and the non-radiative dielectric waveguide including the dielectric waveguide 8 to the resistive terminator 8' for energy absorption.

Figure 5:
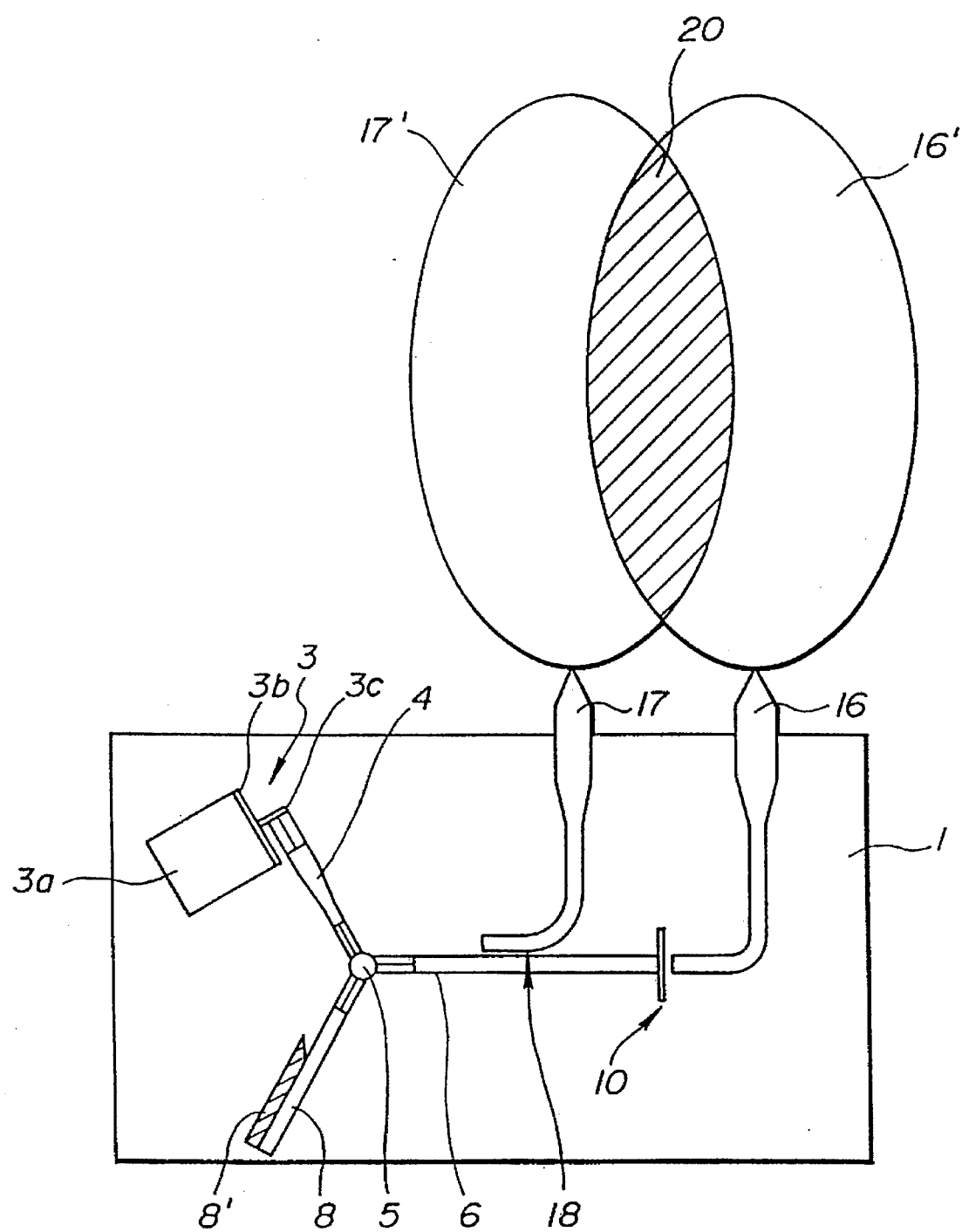
FIG. 5 is a plan view of a modification of the dielectric waveguide radar module shown in FIG. 2(a)

Turning now to a second embodiment shown in FIG. 5, a radar module which includes the non-radiative dielectric waveguide mixer 10 may be incorporated in a radar module having a transmission antenna and a reception antenna that are separate from each other. For example, FIG. 5 shows a modified radar module having a transmission antenna 17 and a reception antenna 16 that are separate from each other, the transmission antenna 17 being coupled to the dielectric waveguide 6 through a directional coupler 18. A portion of a signal that is supplied to antenna 17 is separated by the directional coupler 18. The separated FM signal is propagated through the non-radiative dielectric waveguide to the single-diode mixer 10. A reflected signal received by the reception antenna 16 is propagated through the dielectric waveguide 6 to the single-diode mixer 10.

More specifically, a portion of a high-frequency signal generated by the high-frequency signal generator 3 is propagated through the dielectric waveguide 4, the circulator 5, and the dielectric waveguide 6 to the single-diode mixer 10, and the remaining portion of the high-frequency signal is propagated from the dielectric waveguide 6 through the directional coupler 18 to the transmission antenna 17, which radiates the high-frequency signal. The radiated high-frequency signal is reflected by an object, and received by the reception antenna 16. A portion of the received signal is propagated to the mixer 10 where it is mixed With the portion of the high-frequency signal that has been propagated through the dielectric waveguide 4, the circulator 5, and the dielectric waveguide 6 to the single-diode mixer 10. The remaining portion or the received signal is transmitted through the mixer 10, the dielectric waveguide 6, the circulator 5, and the dielectric waveguide 8 to the resistive terminator 8', which absorbs the energy of the supplied signal.

According to the modified radar module shown in FIG. 5, the transmission antenna 17 has an antenna radiation pattern 17' and the reception antenna 16 has an antenna reception pattern 16'. Therefore, the range in which objects can be detected by the modified radar module is indicated as a hatched range 20 where the antenna patterns 16' and 17' overlap each other. With the common transmission and reception antennas 17 and 16 being independent of each other, the modified radar module provides a hypothetical detection pattern 20 which is laterally narrower than the individual transmission and reception antennas 17 and 16. Consequently, the modified radar module has a high resolution in the lateral direction. For a radar with high hearing resolution, the radar module shown in FIG. 5 is preferable to the radar module shown in FIGS. 2(a) and 2(b).

In the second embodiment, the single lead 14 is used as a line for supplying a bias voltage to the single-diode mixer 10 and loading a beat signal to an external circuit. However, considering the frequency of the beat signal, the lead 14 may be replaced with a coaxial cable or the like.

In each of the above embodiments, a high-frequency signal generator in the form of an FM signal generator may be replaced with a signal generator which generates a signal having a constant frequency to provide a Doppler radar module that is capable of detecting a speed Active to an object from a beat frequency. The high-frequency signal generator may be operated selectively in an FM (frequency-swept) mode or an FM (frequency-fixed) mode at different times for detecting relative distance and speed in a time-division multiplex fashion.

According to the present invention, as described above, the dielectric waveguide mixer as it is incorporated in the dielectric waveguide radar module has a single-diode mixer disposed in and across the dielectric waveguide which propagates, in opposite directions, a high-frequency signal supplied from the high-frequency signal generator to the transmission antenna and a high-frequency signal reflected by an object and received by the reception antenna. With this arrangement, the number of parts of the dielectric waveguide radar module and the size thereof are reduced. Use of the common transmission and reception antenna is effective to further reduce the size of the dielectric waveguide radar module, and increase the maximum detectable distance as the electric power of a local signal may be low.

Unlike the conventional single balanced mixer, the dielectric waveguide mixer according to the present invention is capable of achieving impedance matching without any air gaps and thin films of a high dielectric constant, and is hence freed from a complex adjusting process for impedance matching. Therefore, the dielectric waveguide mixer according to the present invention allows simple small-size radar modules of uniform characteristics to be fabricated on a mass-production basis.

While the dielectric waveguide mixer and the dielectric waveguide radar module have been described as employing the non-radiative dielectric waveguide in the above embodiments, the waveguide used is not limited to the non-radiative dielectric waveguide, but may be a dielectric waveguide such as an H guide or an insular waveguide. Further, as shown in FIGS. 6(a)–6(e), the dielectric waveguide may comprise a single conductive plate. The structures shown in FIGS. 6(a)–6(e) can be grouped into two categories: strongly guiding and weakly guiding. The structures illustrated in FIGS. 6(a)–6(c) comprise modifications of dielectric rods of rectangular cross-sections and include a rectangular rod waveguide (FIG. 6(a)), an image line (FIG. 6(b)), and a trapped image line (FIG. 6(c) ). The structures illustrated in FIGS. 6(d) and 6(e) comprise an insulated image line (FIG. 6(d)) and an inverted strip line (FIG. 6(e)), and are formed by a dielectric strip that perturbs a planar dielectric waveguide.

The high-frequency signal generator is not limited to the gunn diode, but may be any of various other solid-state oscillating elements including an IMPATT diode, a TUNNET diode, a BARIT diode, a TRAPETT diode, an LSA diode, etc.

The dielectric waveguide mixer according to the present invention may be incorporated in general frequency converters including an upconverter, a downconverter, etc., rather than the radar module.

Although there have been described what are at present considered to be the preferred embodiments of the invention, it will be understood that the invention may be embodied in other specific forms without departing from the essential characteristics thereof. The present embodiments are therefore to be considered in all respects as illustrative,. and not restrictive. The scope of the invention is indicated by the appended claims rather than by the foregoing description.

What is claimed:

1. A dielectric waveguide mixer comprising:

at least one conductive plate;

a dielectric waveguide held on said conductive plate;

a solid-state device disposed transversely across said dielectric waveguide and offset a predetermined distance D from a position where the maximum electric field intensity in an LSM01 mode in said dielectric waveguide is exhibited;

a dielectric substrate disposed across said dielectric waveguide and mounting said solid-state device thereon; and attachment means disposed on said dielectric substrate for supplying a bias voltage to said solid-state device, wherein said distance D and the area and shape of said attachment means are selected to control the ratio of the electric power of an electromagnetic wave A that is transmitted through said solid-state device and the electric power of an electromagnetic wave B that is converted by the solid-state device.

2. The dielectric waveguide mixer of claim 1, wherein said attachment means comprises two attachment patterns juxtaposed on said dielectric substrate and spaced from each other.

3. The dielectric waveguide mixer of claim 1, wherein said solid-state device having terminals connected respectively to said attachment patterns and to ¼ choke patterns connected respectively to said attachment patterns.

4. The dielectric waveguide mixer of claim 3, wherein said ¼ choke patterns are disposed on said dielectric substrate.

5. The dielectric waveguide mixer of claim 1, further comprising an upper conductive plate disposed above and extending parallel to said conductive plate which serves as a lower conductive plate.

6. The dielectric waveguide mixer of claim 5, wherein said dielectric waveguide and solid-state device are held between said upper and lower conductive plates.

* * * * *